United States Patent
Okuno et al.

(10) Patent No.: US 9,153,536 B2
(45) Date of Patent: Oct. 6, 2015

(54) AL ALLOY FILM FOR SEMICONDUCTOR DEVICE

(75) Inventors: Hiroyuki Okuno, Kobe (JP); Toshihiro Kugimiya, Kobe (JP); Yoshihiro Yokota, Kobe (JP); Takeaki Maeda, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 107 days.

(21) Appl. No.: 14/117,531

(22) PCT Filed: May 16, 2012

(86) PCT No.: PCT/JP2012/062561
§ 371 (c)(1),
(2), (4) Date: Nov. 13, 2013

(87) PCT Pub. No.: WO2012/157688
PCT Pub. Date: Nov. 22, 2012

(65) Prior Publication Data
US 2015/0171016 A1      Jun. 18, 2015

(30) Foreign Application Priority Data

May 17, 2011    (JP) ................................ 2011-110791

(51) Int. Cl.
*H01L 29/15*      (2006.01)
*H01L 29/22*      (2006.01)
(Continued)

(52) U.S. Cl.
CPC .......... *H01L 23/53219* (2013.01); *C22C 21/00* (2013.01); *C22C 21/02* (2013.01);
(Continued)

(58) Field of Classification Search
CPC ... H01L 27/12; H01L 27/124; H01L 29/4908; H01L 29/458; H01L 29/786; H01L 29/78648
See application file for complete search history.

(56) References Cited

U.S. PATENT DOCUMENTS 5,019,891 A * 5/1991 Onuki et al. ................. 257/763
5,514,909 A    5/1996 Yamamoto et al.
(Continued)

FOREIGN PATENT DOCUMENTS

| JP | 7 90552   | 4/1995 |
|----|-----------|--------|
| JP | 7-90552 A | 4/1995 |

(Continued)

OTHER PUBLICATIONS

Extended European Search Report issued on Aug. 21, 2014 in the corresponding European Application No. 12786105.2.
(Continued)

*Primary Examiner* — Thanh Y Tran
(74) *Attorney, Agent, or Firm* — Oblon, McClelland, Maier & Neustadt, L.L.P.

(57) ABSTRACT

Provided is an Al alloy film for semiconductor devices, which has excellent heat resistance and is suppressed in the generation of hillocks even in cases where the Al alloy film is exposed to high temperatures, and which has low electrical resistivity as a film. The present invention relates to an Al alloy film for semiconductor devices, which is characterized by satisfying all of the features (a)-(c) described below after being subjected to a heat treatment wherein the Al alloy film is held at 500° C. for 30 minutes and by having a film thickness from 500 nm to 5 μm. (a) The maximum grain diameter of the Al matrix is 800 nm or less. (b) The hillock density is less than $1\times10^9$ pieces/$m^2$. (c) The electrical resistivity is 10 μΩcm or less.

19 Claims, 2 Drawing Sheets

(51) Int. Cl.
*H01L 31/0256* (2006.01)
*H01L 31/0296* (2006.01)
*H01L 23/532* (2006.01)
*H01J 37/34* (2006.01)
*C22C 21/02* (2006.01)
*C22C 21/00* (2006.01)
*C22C 21/12* (2006.01)
*C22C 21/14* (2006.01)
*H01L 29/16* (2006.01)
*H01L 29/20* (2006.01)

(52) U.S. Cl.
CPC ............... *C22C 21/12* (2013.01); *C22C 21/14* (2013.01); *H01J 37/3429* (2013.01); *H01L 29/16* (2013.01); *H01L 29/1608* (2013.01); *H01L 29/2003* (2013.01)

(56) References Cited

U.S. PATENT DOCUMENTS

| | | | |
|---|---|---|---|
| 6,033,542 | A | 3/2000 | Yamamoto et al. |
| 6,096,438 | A | 8/2000 | Takagi et al. |
| 7,098,539 | B2 | 8/2006 | Gotoh et al. |
| 7,154,180 | B2 | 12/2006 | Gotoh et al. |
| 7,262,085 | B2 | 8/2007 | Gotoh et al. |
| 7,365,810 | B2 | 4/2008 | Gotoh et al. |
| 7,411,298 | B2 | 8/2008 | Kawakami et al. |
| 7,553,754 | B2 | 6/2009 | Gotoh et al. |
| 7,622,809 | B2 | 11/2009 | Gotoh et al. |
| 7,683,370 | B2 | 3/2010 | Kugimiya et al. |
| 7,781,767 | B2 | 8/2010 | Kawakami et al. |
| 7,803,238 | B2 | 9/2010 | Kugimiya et al. |
| 7,943,933 | B2 | 5/2011 | Hino et al. |
| 7,994,503 | B2 | 8/2011 | Hino et al. |
| 8,044,399 | B2 | 10/2011 | Hino et al. |
| 8,053,083 | B2 | 11/2011 | Gotou et al. |
| 8,088,259 | B2 | 1/2012 | Gotoh et al. |
| 8,163,143 | B2 | 4/2012 | Takagi et al. |
| 8,299,614 | B2 | 10/2012 | Kawakami et al. |
| 8,384,280 | B2 | 2/2013 | Ochi et al. |
| 8,422,207 | B2 | 4/2013 | Nakai et al. |
| 8,482,189 | B2 | 7/2013 | Goto et al. |
| 8,535,997 | B2 | 9/2013 | Kawakami et al. |
| 8,786,090 | B2 * | 7/2014 | Gotou et al. .................. 257/765 |
| 2005/0118811 | A1 | 6/2005 | Murata |
| 2006/0091792 | A1 | 5/2006 | Kugimiya et al. |
| 2006/0181198 | A1 | 8/2006 | Gotoh et al. |
| 2006/0275618 | A1 | 12/2006 | Kugimiya et al. |
| 2008/0081532 | A1 | 4/2008 | Okuno |
| 2008/0121522 | A1 | 5/2008 | Ehira et al. |
| 2008/0223718 | A1 | 9/2008 | Takagi et al. |
| 2008/0272685 | A1 | 11/2008 | Ikeda et al. |
| 2009/0001373 | A1 | 1/2009 | Ochi et al. |
| 2009/0011261 | A1 | 1/2009 | Gotou |
| 2009/0133784 | A1 | 5/2009 | Kugimiya et al. |
| 2009/0176113 | A1 | 7/2009 | Gotoh et al. |
| 2009/0242394 | A1 | 10/2009 | Takagi et al. |
| 2010/0032186 | A1 | 2/2010 | Gotou et al. |
| 2010/0065847 | A1 | 3/2010 | Gotou et al. |
| 2010/0207121 | A1 | 8/2010 | Hino et al. |
| 2010/0328247 | A1 | 12/2010 | Miki et al. |
| 2011/0008640 | A1 | 1/2011 | Goto et al. |
| 2011/0147753 | A1 | 6/2011 | Onishi et al. |
| 2011/0198602 | A1 | 8/2011 | Nanbu et al. |
| 2011/0248272 | A1 | 10/2011 | Ochi et al. |
| 2011/0318607 | A1 | 12/2011 | Kobayashi et al. |
| 2012/0091591 | A1 | 4/2012 | Gotoh et al. |
| 2012/0325655 | A1 | 12/2012 | Iwasaki et al. |

FOREIGN PATENT DOCUMENTS

| | | |
|---|---|---|
| JP | 2000-235961 A | 8/2000 |
| JP | 2005 171378 | 6/2005 |
| JP | 2008 124499 | 5/2008 |
| JP | 2008 270034 | 11/2008 |
| JP | 2009 175720 | 8/2009 |
| JP | 2010-114226 A | 5/2010 |
| WO | 2009 001832 | 12/2008 |

OTHER PUBLICATIONS

Written Opinion Issued Aug. 21, 2012 in PCT/JP12/062561 Filed May 16, 2012.
International Search Report Issued Aug. 21, 2012 in PCT/JP12/062561 Filed May 16, 2012.

* cited by examiner

AL ALLOY FILM FOR SEMICONDUCTOR DEVICE

TECHNICAL FIELD

The present invention relates to an Al alloy film for use in a semiconductor device. Specifically, the present invention relates to an Al alloy film used for, for example, an electrode and an interconnection in a semiconductor device in a semiconductor apparatus.

BACKGROUND ART

Insulated-gate (MOS) type semiconductor devices, such as IGBT (insulated gate bipolar transistor) and power MOSFET (power metal-oxide semiconductor field-effect transistor) are widely used for power device which control large electric power.

Figure 1:
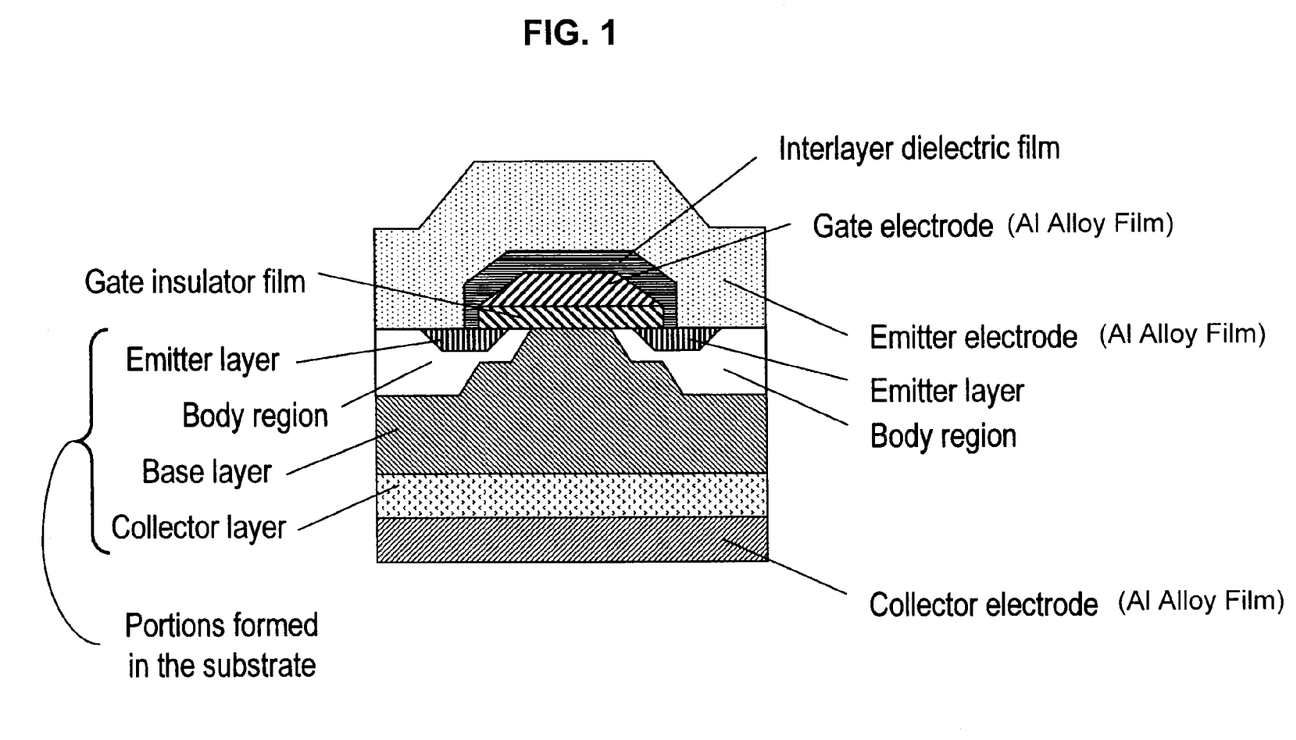
FIG. 1 is a schematic cross-sectional view of a typical insulated gate bipolar transistor (IGBT) having an Al alloy film as a gate electrode, emitter electrode and collector electrode.

A configuration of a general IGBT is explained here by referring to FIG. 1. A collector electrode is connected to a p-type collector layer. An n-type base layer is fabricated on the collector layer. In the upper region of the n-type base layer, a p-type body region is fabricated. Within the body region, an n-type emitter layer is fabricated. A region of the n-type base layer configured in between two emitter layer is a channel region. On top of the channel region, a gate insulating film and a gate electrode are fabricated. On the emitter layer, an emitter electrode is fabricated. These n-type and p-type regions may be fabricated by including elements such as P (phosphorus) and B (boron) in the substrate comprising Si and other material. The n-type and p-type regions may alternatively fabricated by ion-implantation of P, As (arsenic), and B at certain dose amount, acceleration voltage, and implantation angle prescribed for each of the regions, followed by activation heat treatment at temperatures and durations predetermined for each of the regions.

Metal wires and ribbons which are connected with external terminal are connected to upper surface of the emitter electrodes of IGBT. Collector electrodes are directly fixed and connected to circuit board through soldering layer.

In an IGBT with a p-type channel region, an inversion layer is formed in the channel region by applying positive bias to the gate electrode while applying negative and positive bias onto emitter electrode and backside electrode, respectively. An emitter layer and an n-type base layer are electrically connected with each other through the inversion layer. As a result, an electrical current drifts to the collector electrode.

Al-based films such as, for example, pure Al and Al—Si alloy are used for the emitter electrode.

In the process of fabricating the IGBT, ion implantation is carried out to form a collector layer from the back side of the substrate after fabricating an emitter electrode. Subsequently, activation of the implanted ions is promoted by carrying out a heat treatment at 450° C. or lower. Thermal stress by such heat treatment is thus induced to the aforementioned emitter electrode and other portions of the device. Thermal stress is further induced to the aforementioned electrode and other portions of the device in actual operation environment for IGBT which is repeatedly subjected to a temperature range from approximately 250° C. to 350° C.

In cases such as the temperature of the heat treatment exceeds 450° C. in the device fabrication process, and the device is repeatedly subjected to a temperature range from 250° C. to 350° C., the Al-based film constituting the electrode is deteriorated by the formation of so-called hillock which is unusual geometry of surface projection, anomalous deposition of added alloy elements, and inter-diffusion of atoms across the interface of adjacent films. Therefore, the heat treatment temperature has been restricted to 450° C. or lower. The device has also been compelled to be operated at low temperatures.

Patent literature 1, for example, describes a heat treatment at 800° C. to 950° C. for the purpose of activation of the collector layer. The heat treatment at such high temperatures, however, is restricted before fabrication of an interconnection. Once the interconnection is fabricated, the heat treatment is carried out up to about 450° C., and no description is found in the literature referring to heat treatment at higher temperatures. The heat resistance in an actual operation environment is not evaluated at all.

PRIOR ART REFERENCES

Patent Literatures

Patent literature 1: Japanese Patent Application Publication No. 2007-242699

SUMMARY OF INVENTION

Technical Problem to be Solved

As described above, when heat treatment to activate collector layer is conducted for transistors on which an Al-based film is deposited, the heat treatment at high temperatures causes a problem such as unusual geometry of surface projections (hillock formation) in the Al-based film due to thermal stress. In case the heat treatment is conducted at relatively low temperatures, other kinds of problems such as prolonged period of time of nearly 2 hours to activate the collector layer and insufficient activation of the implanted ions may arise.

The thickness of the Al-based film has been made thick, and the upper limit of the heat treatment has been set about 450° C. at the highest. Recently, however, because of stronger demand for improved properties of power semiconductor devices such as IGBT, which increases the need to sufficiently activate the collector layer by heat treatment at higher temperatures, it is required for the Al-based films to possess heat resistance to high-temperature heat treatment.

As described above, there is an occasion for the Al-based films being intermittently subjected to temperatures up to about 450° C. depending on usage and operation environments of the semiconductor device. There is a need for the Al-based films which has excellent heat resistance to such thermal load.

In addition to the heat resistance, there is a need for the Al-based films to have low electrical resistivity. Electrical resistivity of the Al-based films increases with the increase of the amount of alloy elements included in the films. It is required to sufficiently suppress the electrical resistivity of the Al-based films which are subjected to thermal hysteresis in the fabrication process of the semiconductor device.

By the same token, it has been necessary to make the Al-based alloy films thick from a point of view to ensuring the heat resistance. However, there is a need to thin the Al-based films to improve the efficiencies of film deposition process and material cost.

The present invention has been made in light of the circumstances described above. It is an object of the present invention to realize an Al alloy film for use in a semiconductor device, the Al alloy film having excellent high-temperature heat resistance such that the generation of hillocks is suppressed even when the Al alloy film is exposed to a high temperature in a fabrication process of the semiconductor device and/or repeatedly heat treated in an actual usage environment, and having low electrical resistance so that the film may be made thinned in thickness.

It is another object of the present invention to provide a semiconductor equipment (specifically a semiconductor device, and more specifically an electrode and an interconnection for the semiconductor device) having the Al alloy film, and a sputtering target for the fabrication of the Al alloy film.

Solution to Problem

The present invention provides an Al alloy film for semiconductor devices, a sputtering target, a semiconductor equipment, a semiconductor device, an interconnection in a semiconductor device, and semiconductor structure described hereinafter.

(1) An Al alloy film for a semiconductor device having a film thickness from 500 nm to 5 µm, which satisfies all of the features (a)-(c) described below after being subjected to a heat treatment wherein the Al alloy film is held at 500° C. for 30 minutes;
 (a) The maximum grain diameter of the Al matrix is 800 nm or less,
 (b) The hillock density is less than $1 \times 10^9$ pieces/m$^2$, and
 (c) The electrical resistivity is 10 µΩcm or less.

(2) An Al alloy film for a semiconductor device having a film thickness from 500 nm to 5 µm, which satisfies all of the features (a)-(c) described below after being subjected to 5 cycles of heat treatment wherein the Al alloy film is held at 300° C. for 5 hours;
 (a) The maximum grain diameter of the Al matrix is 800 nm or less,
 (b) The hillock density is less than $1 \times 10^9$ pieces/m$^2$, and
 (c) The electrical resistivity is 10 µΩcm or less.

(3) An Al alloy film for a semiconductor device according to (1) or (2), wherein the Al alloy film comprising at least one element (group X element) selected from a group consisting of Ta, Nb, Re, Zr, W, Mo, V, Hf, Ti, Cr and Pt (group X), and at least one of Si and Ge.

(4) An Al alloy film for a semiconductor device according to (3), wherein the Al alloy film further comprising at least one of Ni and Co.

(5) An Al alloy film for a semiconductor device according to (3) or (4), wherein the Al alloy film further comprising Cu.

(6) An Al alloy film for a semiconductor device according to any one of (3) to (5), wherein the amount of the group X element is 0.1 to 5 atomic percent.

(7) An Al alloy film for a semiconductor device according to any one of (3) to (6), wherein the amount of at least one of Si and Ge is 0.1 to 3 atomic percent.

(8) An Al alloy film for a semiconductor device according to any one of (4) to (7), wherein the amount of at least one of Ni and Co is 0.1 to 3 atomic percent.

(9) An Al alloy film for a semiconductor device according to any one of (5) to (8), wherein the amount of Cu is 0.1 to 2 atomic percent.

(10) A sputtering target for fabricating an Al alloy film for a semiconductor device according to any one of (1) to (9), which comprises at least one element (group X element) selected from a group consisting of Ta, Nb, Re, Zr, W, Mo, V, Hf, Ti, Cr and Pt (group X) in an amount of 0.1 to 5 atomic percent, and at least either of Si and Ge in an amount of 0.1 to 3 atomic percent.

(11) A sputtering target according to (10) further comprising at least one of Ni and Co in an amount of 0.1 to 3 atomic percent.

(12) A sputtering target according to (10) or (11) further comprising Cu in an amount of 0.1 to 2 atomic percent.

(13) A sputtering target according to any one of (10) to (12), in which the balance being Al and incidental impurities.

(14) A semiconductor apparatus including the Al alloy film for a semiconductor device described in any one of (1) to (9).

(15) A semiconductor device including the Al alloy film for a semiconductor device described in any one of (1) to (9).

(16) An electrode for a semiconductor device comprising the Al alloy film for a semiconductor device described in any one of (1) to (9).

(17) An interconnection for a semiconductor device comprising the Al alloy film for a semiconductor device described in any one of (1) to (9).

(18) A semiconductor structure having at least one of the Al alloy film for a semiconductor device described in any one of (1) to (9) on a substrate, wherein the substrate and the Al alloy film are in direct contact with each other.

(19) A semiconductor structure according to (18), wherein the substrate is a Si substrate or a SiC substrate or a GaN substrate.

Advantage of the Invention

According to the present invention, since the Al alloy film is superior in heat resistance (heat resistance at high temperatures in particular), heat treatment for a purpose of activation of ions in a collector layer may be carried out at high temperature in, for example, a fabrication process of IGBT having the Al alloy film as an electrode or an interconnection of the semiconductor device. Deterioration of device characteristics may also be reduced even in a case where the semiconductor device is repeatedly subjected to a temperature range from approximately 250° C. to 350° C. in actual operation environment. Moreover, an Al alloy film having low electrical resistivity and thus a reduced film thickness may be provided. As a result, a power semiconductor device of improved characteristics having the Al alloy film, and a semiconductor device having superior characteristics such as the IGBT including the semiconductor device, may be provided.

BRIEF DESCRIPTION OF DRAWINGS

FIGS. 2A-2I are pattern diagrams showing the relation between heat treatment condition and grain diameter of the Al matrix in the Al alloy film. FIGS. 2A-2D are those of the Al alloy films of the present invention after the first heat treatment (FIG. 2A; heat treated at 450° C. for 30 minutes, FIG. 2B; heat treated at 500° C. for 30 minutes, FIG. 2C; heat treated at 550° C. for 30 minutes, and FIG. 2D; heat treated at 600° C. for 30 minutes). FIGS. 2A-2H correspond to the Al alloy films shown in FIGS. 2A-2D, respectively, after the second heat treatment at 500° C. for 30 minutes.

DESCRIPTION OF EMBODIMENTS

The present inventors have conducted intensive studies in order to solve the technical problem. As a result, it has been found that an Al alloy film which satisfies requirements specified in the present invention (particularly the maximum grain diameter of the Al matrix of 800 nm or less) amazingly demonstrates excellent heat resistance with a controlled hillock density of less than $1\times10^9$ pieces/m$^2$ and electrical resistivity of 10 μΩcm or less even after being subjected to high temperature heat treatment in the fabrication process of a semiconductor device or repeatedly subjected to heat treatment in an actual operation environment. The present invention is described in detail hereinafter.

The Al alloy film of the present invention is characterized in having a film thickness from 500 nm to 5 μm, and satisfying all of the features (a)-(c) described below after being subjected to a heat treatment wherein the Al alloy film is held at 500° C. for 30 minutes (hereafter referred to as "heating pattern 1");

(a) The maximum grain diameter of the Al matrix is 800 nm or less, (b) The hillock density is less than $1\times10^9$ pieces/m$^2$, and (c) The electrical resistivity is 10 μΩcm or less.

The Al alloy film of the present invention satisfies all of the features (a)-(c) described above, in spite of the presence or absence of a heat treatment prior to the heating pattern 1 (heat treatment to hold for 30 minutes at 500° C.), or regardless of the condition of heat treatment carried out prior to the heating pattern 1. Accordingly, the Al alloy film of the present invention satisfies all of the features (a)-(c) described above in a case the film is subjected to high temperature of 450-600° C. in the fabrication process of the semiconductor device, followed by a heat treatment of the heating pattern 1.

Heating atmosphere of the heating pattern 1 is either an inert gas atmosphere or a vacuum atmosphere.

The maximum grain diameter of the Al matrix of (a) is preferably 700 nm or less, and more preferably 500 nm or less. The maximum grain diameter of the Al matrix is measured in a manner shown in an example described later.

Specified in the feature (b) is the density of hillocks (unusual geometry of surface projection of Al alloy film induced by thermal stress) formed by heat treatment on the surface of the Al alloy film. In the present invention the hillock density is preferably less than $5\times10^8$ pieces/m$^2$, and more preferably less than $1\times10^8$ pieces/m$^2$. The hillock density is measured in a manner shown in an example described later.

The electrical resistivity of (c) is preferably 9.0 μΩcm or less, more preferably 8.0 μΩcm or less, even more preferably 7.0 μΩcm or less, and particularly preferably 6.0 μΩcm or less. The electrical resistivity is measured in a manner shown in an example described later.

The thickness of the Al alloy film of the present invention is from 500 nm to 5 μm. It is preferably 4 μm or less, and more preferably 3 μm or less in order to improve the efficiency of film fabrication or to downsize the apparatus. From the point of view to obtaining an Al film of higher heat resistance, the film thickness is preferably 700 nm or more, and more preferably 1 μm or more.

Furthermore, the Al alloy film of the present invention for a semiconductor device is characterized in having a film thickness from 500 nm to 5 μm, and satisfying all of the features (a)-(c) described above after being subjected to 5 cycles of heat treatment wherein the Al alloy film is held at 300° C. for 5 hours (hereafter referred to as "heating pattern 2").

Actual operation environment is assumed by the 5 cycles of heat treatment holding the film at 300° C. for 5 hours. The Al alloy film of the present invention satisfies all of the features (a)-(c) described above, in spite of the presence or absence of a heat treatment prior to the heating pattern 2 (5 cycles of heat treatment to hold for 5 hours at 300° C.), or regardless of the condition of heat treatment carried out prior to the heating pattern 2. Accordingly, the Al alloy film of the present invention satisfies all of the features (a)-(c) described above in a case the film is subjected to high temperature of 450-600° C. in the fabrication process of the semiconductor device, followed by a heat treatment of the heating pattern 2.

Heating atmosphere of the heating pattern 2 is either an inert gas atmosphere or a vacuum atmosphere.

The specifications of (a)-(c) and film thickness of the Al alloy films for which the heating pattern 2 is conducted are the same as those of the heating pattern 1.

In order to obtain the Al alloy film, it is suggested to make an Al alloy film to have the composition as shown next. It is thus suggested to make the film to be Al-group X element-Si and/or Ge, which comprises at least one element (group X element) selected from a group consisting of Ta, Nb, Re, Zr, W, Mo, V, Hf, Ti, Cr and Pt (group X), and at least one of Si and Ge.

Here, the elements in group X described above are refractory metals each having a melting point of about 1600° C. or higher and each contribute to improvement in heat resistance at high temperatures. These elements may be added alone or in combination of two or more.

The amount of the group X element (when one of the elements is added, the amount is based on the amount of the element contained; and when two or more of the elements are added, the amount is based on the total amount of the elements) is preferably in the range of 0.1 to 5 atomic percent. An amount of the group X element of less than 0.1 atomic percent may not effectively result in the foregoing effects. Preferred lower limit of the amount of the group X element is thus set at 0.1 atomic percent. More preferred amount of the group X element is 0.2 atomic percent or more, and even more preferred is 0.3 atomic percent or more. A amount of the group X element exceeding 5 atomic percent may result in an excessive increase in the electrical resistance of the Al alloy film itself and may cause a problem in which, for example, residues are easily formed during a fabrication process of interconnection. Preferred upper limit of the amount of the group X element is thus set at 5 atomic percent. The amount of the group X element is more preferably 3.0 atomic percent or less, and still more preferably 2.0 atomic percent or less.

Moreover, Si and/or Ge described above are elements that contribute to improvement in high-temperature heat resistance by being contained in combination with the aforementioned group X element. They also have an effect to suppress inter-diffusion of atoms between the Al alloy film and Si substrate or like, which the group X elements do not have.

The amount of Si and/or Ge (when one of the elements is added, the amount is based on the amount of the element contained; and when two of the elements are added, the amount is based on the total amount of the elements) is preferably in the range of 0.1 to 3 atomic percent in order to obtain the above-mentioned effects. If the contained amount of Si and/or Ge is less than 0.1 atomic percent, the element(s) may not contribute to improvement of heat resistance and effectively exert the effect to suppress diffusion. Preferred lower limit of the amount of Si and/or Ge is thus set at 0.1 atomic percent. More preferred amount of Si and/or Ge is 0.3 atomic percent or more, and even more preferred is 0.5 atomic percent or more. A amount of Si and/or Ge exceeding 3 atomic percent may result in an excessive increase in the electrical resistance of the Al alloy film itself and may cause a problem in which, for example, residues are easily formed during a fabrication process of interconnection. Preferred upper limit of the amount of Si and/or Ge is thus set at 3 atomic percent. The amount of Si and/or Ge is more preferably 2.5 atomic percent or less, and still more preferably 2.0 atomic percent or less.

The Al alloy films of the present invention include those which comprise the group X element, Si and/or Ge, and the balance being Al and incidental impurities. Other examples are those which comprise the group X element, Si and/or Ge, Ni and/or Co, Cu, and the balance being Al and incidental impurities.

Here, examples of the incidental impurities include Fe, O, C, N, and Ar. Each of the incidental impurities may be contained in an amount of less than 0.1 weight percent.

The Al alloy film of the present invention may contain above-mentioned group X element, Si and/or Ge, and Ni and/or Co or Cu.

Nickel (Ni) and Co are elements which enable further improvement of heat resistance. These elements may be added alone or together. The amount of Ni and/or Co (when one of the elements is added, the amount is based on the amount of the element contained; and when two of the elements are added, the amount is based on the total amount of the elements) is preferably in the range of 0.1 to 3 atomic percent in order to obtain such effect. If the contained amount of Ni and/or Co is less than 0.1 atomic percent, the element(s) may not may not effectively result in the desired effects. Preferred lower limit of the amount of Ni and/or Co is thus set at 0.1 atomic percent. On the other hand, an amount of Ni and/or Co exceeding 3 atomic percent may result in an excessive increase in the electrical resistance of the Al alloy film itself. Preferred upper limit of the amount of the elements is 1.0 atomic percent, and more preferably 0.6 atomic percent.

Copper (Cu) is also an element which enable further improvement of heat resistance. The amount of Cu is preferably in the range of 0.1 to 2 atomic percent in order to obtain such effect. If the contained amount of Cu is less than 0.1 atomic percent, it becomes difficult to obtain the desired effect. Preferred lower limit of the amount of Cu is thus set at 0.1 atomic percent. More preferred amount of Cu is 0.3 atomic percent or more, and even more preferred is 0.5 atomic percent or more. On the other hand, an amount of Cu exceeding 2 atomic percent may result in an excessive increase in the electrical resistance of the Al alloy film itself. Preferred upper limit of the amount of the element is 1.5 atomic percent, and more preferably 1.0 atomic percent.

The Al alloy film is preferably formed by a sputtering method with a sputtering target (hereinafter, also referred to as a "target") because a thin film having excellent in-plane uniformity in components and thickness can be easily formed, as compared with the cases where a thin film is formed by an ion-plating method, an electron-beam evaporation method, or a vacuum evaporation method.

In the case where the Al alloy film is formed by the sputtering method, an Al alloy sputtering target containing the foregoing elements and having a composition the same as the composition of a desired Al alloy film is suitably used as the target because the use of the target eliminates composition deviation and results in the formation of an Al alloy film having an intended composition.

In the present invention, sputtering targets having the same compositions as the Al alloy films are also included in the scope of the present invention. Specifically, the targets include a target containing 0.1 to 5 atomic percent of at least one element selected from the group (group X) consisting of Ta, Nb, Re, Zr, W, Mo, V, Hf, Ti, Cr, and Pt, and 0.1 to 3 atomic percent of Si and/or Ge, and the balance being Al and incidental impurities. In addition, the targets include a target further containing 0.1 to 3 atomic percent of Ni and/or Co, and the balance being Al and incidental impurities. The targets also include a target further containing 0.1 to 2 atomic percent of Cu, and the balance being Al and incidental impurities.

Here, examples of the incidental impurities include Fe, O, C, N, and Ar. Each of the incidental impurities may be contained in an amount of less than 0.1 weight percent.

With respect to the shape of the target, the target may be processed into any shape (a square plate-like shape, a circular plate-like shape, a doughnut plate-like shape, a cylinder shape, or the like) corresponding to the shape and structure of a sputtering apparatus.

Examples of a method for producing the target include a method in which an ingot composed of an Al-base alloy is produced by a melt-casting process, a powder sintering process, or a spray forming process to form a target; and a method in which after a preform (intermediate before the final dense product) composed of an Al-based alloy is produced, the preform is densified by densification means to form a target.

The present invention encompasses a semiconductor apparatus having the Al alloy film. The Al alloy film of the present invention sufficiently exert the above-described effects if it is used for the semiconductor apparatus, specifically for a semiconductor device, and more specifically for an electrode and an interconnection of the semiconductor device, such as, for example, for an emitter electrode for an aforementioned IGBT.

The Al alloy film of the present invention may be in contact with Si substrate, SiC substrate, or GaN substrate in a semiconductor apparatus, specifically in a semiconductor device. The Al alloy film may be in direct contact with the substrate. Between the Al alloy film and the substrate, there may be an interlayer passivation film such as silicon oxide and silicon nitride, and/or a semiconductor thin film such as Si, SiC, and GaN.

The semiconductor structure of the present invention having at least the Al alloy film for a semiconductor device on a substrate offers an excellent semiconductor property by suppressing inter-diffusion of atoms between the substrate and the Al alloy film, even in a case where the Al alloy film is in direct contact with the substrate such as, for example, Si substrate, SiC substrate, and GaN substrate.

In the fabrication process of a semiconductor apparatus (specifically a semiconductor device in, for example, an IGBT) of the present invention, a high temperature heat treatment at 450-600° C. may be carried out after fabricating an Al alloy film of the present invention for the semiconductor device. As described above, in the Al alloy film of the present invention for a semiconductor device, formation of hillocks is suppressed due to the excellent heat resistance even in a case the film is subjected at such high temperatures.

A semiconductor apparatus and a semiconductor device having the Al alloy film of the present invention may be fabricated in a general manner except that the above-mentioned high temperature heat treatment can be carried out.

EXAMPLES

The present invention is more specifically described below by presenting examples. The present invention is not limited to these examples described below. The present invention may be modified and performed without departing from the essence of the present invention described above and below. They are also within the technical scope of the present invention.

Example 1

An Al alloy film of 500 nm in thickness having each of various alloy compositions shown in Table 1 and Table 2 was deposited by the DC magnetron sputtering method. The deposition condition was as follows. Atmosphere gas: argon, pressure: 2 mTorr, substrate temperature: 25° C. (room temperature). Single crystal Si of orientation [100] with a size of 4 inches in diameter was used as a substrate.

For the preparation of the foregoing Al alloy films of having various compositions, Al alloy targets having various compositions, which were formed by the vacuum melting method, were used as a sputtering target.

A content of each of the alloying elements in the foregoing Al alloy films was determined by the ICP emission spectrometry (inductively coupled plasma emission spectrometry) method.

Each of the Al alloy films prepared as described above was subjected to heat treatment as shown below. Then heat resistance, electrical resistivity, and the maximum grain diameter of the Al matrix of the Al alloy films were measured. Details are described hereinafter.

(1) Heat Resistance after Heat Treatment

Each of the Al alloy film was subjected to a series of heat treatment, simulating a thermal process to which an interconnection material is subjected in a fabrication process of a semiconductor device, at 450° C., 500° C., 550° C., and 600° C. in an inert ($N_2$) gas atmosphere for 30 minutes at each of the temperature as indicated in Tables 1 and 2 (the first heat treatment). Subsequently, each of the Al alloy film was subjected to five cycles of heat treatment, simulating a thermal process to which an interconnection material is subjected in an actual operation environment, at 500° C. for 30 minutes as shown in Tables 1 and 2 (the second heat treatment; heating pattern 1). The surface morphology of the Al alloy films were observed after the heat treatments with an optical microscope (magnification: ×500) to measure the density of hillocks (pieces/m²). The number of hillocks having a diameter of 0.1 μm or more was counted.

The heat resistance was evaluated according to evaluation criteria described in Table 3. In this example, ⊚, ○, and Δ indicate that the corresponding films were acceptable. The results are shown in Table 1 and Table 2.

(2) Electrical Resistivity (Interconnection Resistance) of Al Alloy Film after Heat Treatment A line-and-space pattern 10 μm in width was formed on the deposited Al alloy film samples. Each of the sample was subjected to a series of heat treatment, simulating a thermal process to which an interconnection material is subjected in a fabrication process of a semiconductor device, at 450° C., 500° C., 550° C., and 600° C. in an inert ($N_2$) gas atmosphere for 30 minutes at each of the temperature as indicated in Tables 1 and 2 (the first heat treatment). Subsequently, each of the Al alloy film was subjected to five cycles of heat treatment, simulating a thermal process to which an interconnection material is subjected in an actual operation environment, at 500° C. for 30 minutes as shown in Tables 1 and 2 (the second heat treatment; heating pattern 1). Electrical resistivity of the Al alloy film was measured by four-terminal method.

The electrical resistivity was evaluated according to evaluation criteria described in Table 3. In this example, ⊚, ○, and Δ indicate that the corresponding films are acceptable. The results are shown in Table 1 and Table 2.

(3) The Maximum Grain Diameter of the Al Matrix after Heat Treatment

Each of the deposited Al alloy film was subjected to a series of heat treatment, simulating a thermal process to which an interconnection material is subjected in a fabrication process of a semiconductor device, at 450° C., 500° C., 550° C., and 600° C. in an inert ($N_2$) gas atmosphere for 30 minutes at each of the temperature as indicated in Tables 1 and 2 (the first heat treatment). Subsequently, each of the Al alloy film was subjected to five cycles of heat treatment, simulating a thermal process to which an interconnection material is subjected in an actual operation environment, at 500° C. for 30 minutes as shown in Tables 1 and 2 (the second heat treatment). The surface of the Al alloy film after the heat treatment was observed with a planar transmission electron microscope (TEM, magnification: ×150,000). The grain diameters of the Al matrix (equivalent circle diameter) observed in three fields of view (area size of one field of view is 1.2 μm×1.6 μm) at arbitrary positions of each sample were measured, and the maximum value was determined as the maximum grain size.

The grain diameter was evaluated according to evaluation criteria described in Table 3. In this example, ⊚, ○, and Δ indicate that the corresponding films are acceptable. The results are shown in Table 1 and Table 2.

TABLE 1

| No. | Chemical composition (The numerical value represents content of each element in atomic %.) | The 2nd heat treatment condition (heating pattern 1) | The 1st heat treatment condition: 450° C. - 30 min. | | | The 1st heat treatment condition: 500° C. - 30 min. | | | The 1st heat treatment condition: 550° C. - 30 min. | | | The 1st heat treatment condition: 600° C. - 30 min. | | |
|---|---|---|---|---|---|---|---|---|---|---|---|---|---|---|
| | | | maximum grain diameter | Hillock density | Electrical resistivity | maximum grain diameter | Hillock density | Electrical resistivity | maximum grain diameter | Hillock density | Electrical resistivity | maximum grain diameter | Hillock density | Electrical resistivity |
| 1 | Al—1Si | 500° C. - 30 min. | X | X | ◎ | X | X | ◎ | X | X | ◎ | X | X | ◎ |
| 2 | Al—2Nd | 500° C. - 30 min. | X | X | ○ | X | X | ◎ | X | X | ◎ | X | X | X |
| 3 | Al—0.5Ta | 500° C. - 30 min. | X | X | ◎ | ○ | X | X | ○ | X | X | △ | X | X |
| 4 | Al—5Ta | 500° C. - 30 min. | ◎ | ○ | △ | ◎ | X | X | ○ | ○ | ○ | △ | ○ | X |
| 5 | Al—0.5Ge—0.5Ta | 500° C. - 30 min. | ◎ | ◎ | ◎ | ◎ | ◎ | ◎ | ○ | ◎ | ◎ | △ | ◎ | ◎ |
| 6 | Al—0.1Ni—0.5Ge—0.1Ta | 500° C. - 30 min. | ◎ | ◎ | ◎ | ◎ | ◎ | ◎ | ○ | ◎ | ○ | △ | ◎ | ◎ |
| 7 | Al—0.1Ni—0.5Ge—0.5Ta | 500° C. - 30 min. | ◎ | ◎ | ◎ | ◎ | ◎ | ◎ | ○ | ◎ | ◎ | ○ | ◎ | ◎ |
| 8 | Al—0.1Ni—0.5Ge—5Ta | 500° C. - 30 min. | ◎ | ◎ | ◎ | ◎ | ◎ | ○ | ○ | ◎ | ◎ | ○ | ◎ | ○ |
| 9 | Al—3Ni—0.5Ge—0.5Ta | 500° C. - 30 min. | ◎ | ◎ | ◎ | ◎ | ◎ | ◎ | ○ | ◎ | ◎ | ○ | ◎ | ◎ |
| 10 | Al—0.1Ni—2Ge—0.5Ta | 500° C. - 30 min. | ◎ | ◎ | ◎ | ◎ | ◎ | ◎ | ○ | ◎ | ◎ | △ | ◎ | ◎ |
| 11 | Al—0.1Ni—0.5Ge—0.5Nb | 500° C. - 30 min. | ◎ | ◎ | ◎ | ◎ | ◎ | ◎ | ○ | ◎ | ◎ | △ | ◎ | ◎ |
| 12 | Al—0.1Ni—0.5Ge—0.5Re | 500° C. - 30 min. | ◎ | ◎ | ◎ | ◎ | ◎ | ◎ | ○ | ◎ | ◎ | △ | ◎ | ◎ |
| 13 | Al—0.1Ni—0.5Ge—0.5Zr | 500° C. - 30 min. | ◎ | ◎ | ◎ | ◎ | ◎ | ◎ | ○ | ◎ | ◎ | △ | ◎ | ◎ |
| 14 | Al—0.1Ni—0.5Ge—0.5W | 500° C. - 30 min. | ◎ | ◎ | ◎ | ◎ | ◎ | ◎ | ○ | ◎ | ◎ | △ | ◎ | ◎ |
| 15 | Al—0.1Ni—0.5Ge—0.5Mo | 500° C. - 30 min. | ◎ | ◎ | ◎ | ◎ | ◎ | ◎ | ○ | ◎ | ◎ | △ | ◎ | ◎ |
| 16 | Al—0.1Ni—0.5Ge—0.5V | 500° C. - 30 min. | ◎ | ◎ | ◎ | ◎ | ◎ | ◎ | ○ | ◎ | ◎ | △ | ◎ | ◎ |
| 17 | Al—0.1Ni—0.5Ge—0.5Hf | 500° C. - 30 min. | ◎ | ◎ | ◎ | ◎ | ◎ | ◎ | ○ | ◎ | ◎ | △ | ◎ | ◎ |
| 18 | Al—0.1Ni—0.5Ge—0.5Ti | 500° C. - 30 min. | ◎ | ◎ | ◎ | ◎ | ◎ | ◎ | ○ | ◎ | ◎ | △ | ◎ | ◎ |
| 19 | Al—0.1Ni—0.5Ge—0.5Cr | 500° C. - 30 min. | ◎ | ◎ | ◎ | ◎ | ◎ | ◎ | ○ | ◎ | ◎ | ○ | ○ | ○ |
| 20 | Al—0.1Ni—0.5Ge—0.5Pt | 500° C. - 30 min. | ◎ | ◎ | ◎ | ◎ | ◎ | ◎ | ○ | ◎ | ◎ | △ | ◎ | ◎ |
| 21 | Al—0.1Ni—0.5Ge—0.5Ta—0.5Zr | 500° C. - 30 min. | ◎ | ◎ | ◎ | ◎ | ◎ | ◎ | ○ | ◎ | ◎ | △ | ◎ | ◎ |
| 22 | Al—0.1Ni—0.5Ge—0.5Cu—0.5Ta | 500° C. - 30 min. | ◎ | ◎ | ○ | ◎ | ◎ | ○ | ○ | ○ | ○ | ○ | ○ | ○ |
| 23 | Al—0.1Co—0.5Ge—0.5Ta | 500° C. - 30 min. | ◎ | ◎ | ◎ | ◎ | ◎ | ◎ | ○ | ◎ | ◎ | △ | ◎ | ◎ |
| 24 | Al—0.5Si—0.5Ta | 500° C. - 30 min. | ◎ | ◎ | ◎ | ◎ | ◎ | ◎ | ○ | ◎ | ◎ | △ | ◎ | ◎ |
| 25 | Al—0.1Ni—0.5Si—0.1Ta | 500° C. - 30 min. | ◎ | ◎ | ◎ | ◎ | ◎ | ◎ | ○ | ◎ | ◎ | △ | ◎ | ◎ |
| 26 | Al—0.1Ni—0.5Si—0.5Ta | 500° C. - 30 min. | ◎ | ◎ | ◎ | ◎ | ◎ | ◎ | ○ | ◎ | ◎ | ○ | ◎ | ○ |
| 27 | Al—0.1Ni—0.5Si—5Ta | 500° C. - 30 min. | ◎ | ◎ | ○ | ◎ | ◎ | ○ | ○ | ○ | ○ | ○ | ○ | ○ |
| 28 | Al—3Ni—0.5Si—0.5Ta | 500° C. - 30 min. | ◎ | ◎ | ◎ | ◎ | ◎ | ◎ | ○ | ◎ | ◎ | △ | ◎ | ◎ |
| 29 | Al—0.1Ni—2Si—0.5Ta | 500° C. - 30 min. | ◎ | ◎ | ◎ | ◎ | ◎ | ◎ | ○ | ◎ | ◎ | △ | ◎ | ◎ |
| 30 | Al—0.1Ni—0.5Si—0.5Nb | 500° C. - 30 min. | ◎ | ◎ | ◎ | ◎ | ◎ | ◎ | ○ | ◎ | ◎ | ○ | ◎ | ○ |
| 31 | Al—0.1Ni—0.5Si—0.5Re | 500° C. - 30 min. | ◎ | ◎ | ◎ | ◎ | ◎ | ◎ | ○ | ◎ | ◎ | △ | ◎ | ◎ |
| 32 | Al—0.1Ni—0.5Si—0.5Zr | 500° C. - 30 min. | ◎ | ◎ | ◎ | ◎ | ◎ | ◎ | ○ | ◎ | ◎ | △ | ◎ | ◎ |
| 33 | Al—0.1Ni—0.5Si—0.5W | 500° C. - 30 min. | ◎ | ◎ | ◎ | ◎ | ◎ | ◎ | ○ | ◎ | ◎ | △ | ◎ | ◎ |

TABLE 2

| No. | Chemical composition (The numerical value represents content of each element in atomic %.) | The 2nd heat treatment condition (heating pattern 1) | The 1st heat treatment condition: 450° C. - 30 min. | | | The 1st heat treatment condition: 500° C. - 30 min. | | | The 1st heat treatment condition: 550° C. - 30 min. | | | The 1st heat treatment condition: 600° C. - 30 min. | | |
|---|---|---|---|---|---|---|---|---|---|---|---|---|---|---|
| | | | maximum grain diameter | Hillock density | Electrical resistivity | maximum grain diameter | Hillock density | Electrical resistivity | maximum grain diameter | Hillock density | Electrical resistivity | maximum grain diameter | Hillock density | Electrical resistivity |
| 34 | Al—0.1Ni—0.5Si—0.5Mo | 500° C. - 30 min. | ⊚ | ⊚ | ⊚ | ⊚ | ⊚ | ⊚ | ○ | ⊚ | ⊚ | △ | ⊚ | ⊚ |
| 35 | Al—0.1Ni—0.5Si—0.5V | 500° C. - 30 min. | ⊚ | ⊚ | ⊚ | ⊚ | ⊚ | ⊚ | ○ | ⊚ | ⊚ | △ | ⊚ | ⊚ |
| 36 | Al—0.1Ni—0.5Si—0.5Hf | 500° C. - 30 min. | ⊚ | ⊚ | ⊚ | ⊚ | ⊚ | ⊚ | ○ | ⊚ | ⊚ | △ | ⊚ | ⊚ |
| 37 | Al—0.1Ni—0.5Si—0.5Ti | 500° C. - 30 min. | ⊚ | ⊚ | ⊚ | ⊚ | ⊚ | ⊚ | ○ | ⊚ | ⊚ | △ | ⊚ | ⊚ |
| 38 | Al—0.1Ni—0.5Si—0.5Cr | 500° C. - 30 min. | ⊚ | ⊚ | ⊚ | ⊚ | ⊚ | ⊚ | ○ | ⊚ | ⊚ | △ | ⊚ | ⊚ |
| 39 | Al—0.1Ni—0.5Si—0.5Pt | 500° C. - 30 min. | ⊚ | ⊚ | ⊚ | ⊚ | ⊚ | ⊚ | ○ | ⊚ | ⊚ | △ | ⊚ | ⊚ |
| 40 | Al—0.1Ni—0.5Si—0.5Ta—0.5Zr | 500° C. - 30 min. | ⊚ | ⊚ | ⊚ | ⊚ | ⊚ | ⊚ | ○ | ⊚ | ⊚ | ○ | ○ | ⊚ |
| 41 | Al—0.1Ni—0.5Si—0.5Cu—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 42 | Al—0.1Co—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 43 | Al—0.5Ge—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 44 | Al—0.1Ni—0.5Ge—0.5Si—0.1Ta | 500° C. - 30 min. | ⊚ | ⊚ | ⊚ | ⊚ | ⊚ | ⊚ | ○ | ○ | ⊚ | △ | ○ | ○ |
| 45 | Al—0.1Ni—0.5Ge—0.3Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 46 | Al—0.1Ni—0.5Ge—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 47 | Al—0.1Ni—0.5Ge—1.0Si—0.5Ta | 500° C. - 30 min. | ⊚ | ⊚ | ○ | ⊚ | ⊚ | ○ | ○ | ⊚ | ○ | ○ | ⊚ | ⊚ |
| 48 | Al—0.1Ni—0.5Ge—2.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 49 | Al—0.1Ni—0.5Ge—0.5Si—5Ta | 500° C. - 30 min. | ⊚ | ⊚ | ⊚ | ⊚ | ⊚ | ⊚ | ○ | ⊚ | ⊚ | ○ | ⊚ | ⊚ |
| 50 | Al—3Ni—0.5Ge—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 51 | Al—0.1Ni—2Ge—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 52 | Al—0.1Ni—0.5Ge—0.5Si—0.5Nb | 500° C. - 30 min. | ⊚ | ⊚ | ⊚ | ⊚ | ⊚ | ⊚ | ○ | ⊚ | ⊚ | △ | ⊚ | ⊚ |
| 53 | Al—0.1Ni—0.5Ge—0.5Si—0.5Re | 500° C. - 30 min. | ⊚ | ⊚ | ⊚ | ⊚ | ⊚ | ⊚ | ○ | ⊚ | ⊚ | ○ | ○ | ⊚ |
| 54 | Al—0.1Ni—0.5Ge—0.5Si—0.5Zr | 500° C. - 30 min. | ⊚ | ⊚ | ⊚ | ⊚ | ⊚ | ⊚ | ○ | ⊚ | ⊚ | △ | ⊚ | ⊚ |
| 55 | Al—0.1Ni—0.5Ge—0.5Si—0.5W | 500° C. - 30 min. | ⊚ | ⊚ | ⊚ | ⊚ | ⊚ | ⊚ | ○ | ⊚ | ⊚ | △ | ⊚ | ⊚ |
| 56 | Al—0.1Ni—0.5Ge—0.5Si—0.5Mo | 500° C. - 30 min. | ⊚ | ⊚ | ⊚ | ⊚ | ⊚ | ⊚ | ○ | ⊚ | ⊚ | △ | ⊚ | ⊚ |
| 57 | Al—0.1Ni—0.5Ge—0.5Si—0.5V | 500° C. - 30 min. | ⊚ | ⊚ | ⊚ | ⊚ | ⊚ | ⊚ | ○ | ⊚ | ⊚ | △ | ⊚ | ⊚ |
| 58 | Al—0.1Ni—0.5Ge—0.5Si—0.5Hf | 500° C. - 30 min. | ⊚ | ⊚ | ⊚ | ⊚ | ⊚ | ⊚ | ○ | ⊚ | ⊚ | △ | ⊚ | ⊚ |
| 59 | Al—0.1Ni—0.5Ge—0.5Si—0.5Ti | 500° C. - 30 min. | ⊚ | ⊚ | ⊚ | ⊚ | ⊚ | ⊚ | ○ | ⊚ | ⊚ | △ | ⊚ | ⊚ |
| 60 | Al—0.1Ni—0.5Ge—0.5Si—0.5Cr | 500° C. - 30 min. | ⊚ | ⊚ | ⊚ | ⊚ | ⊚ | ⊚ | ○ | ⊚ | ⊚ | △ | ⊚ | ⊚ |
| 61 | Al—0.1Ni—0.5Ge—0.5Si—0.5Pt | 500° C. - 30 min. | ⊚ | ⊚ | ⊚ | ⊚ | ⊚ | ⊚ | ○ | ⊚ | ⊚ | △ | ⊚ | ⊚ |
| 62 | Al—0.1Ni—0.5Ge—0.3Si—0.5Ta—0.5Zr | 500° C. - 30 min. | ⊚ | ⊚ | ⊚ | ⊚ | ⊚ | ⊚ | ○ | ⊚ | ⊚ | ○ | ○ | ⊚ |
| 63 | Al—0.1Ni—0.5Ge—0.5Si—0.5Ta—0.5Zr | 500° C. - 30 min. | ⊚ | ⊚ | ⊚ | ⊚ | ⊚ | ⊚ | ○ | ⊚ | ⊚ | ○ | ○ | ⊚ |
| 64 | Al—0.1Ni—0.5Ge—2.5Si—0.5Ta—0.5Zr | 500° C. - 30 min. | ⊚ | ⊚ | ⊚ | ⊚ | ⊚ | ⊚ | ○ | ⊚ | ⊚ | △ | ⊚ | ⊚ |
| 65 | Al—0.1Ni—0.5Ge—0.5Si—0.5Cu—0.5Ta | 500° C. - 30 min. | ⊚ | ⊚ | ⊚ | ⊚ | ⊚ | ⊚ | ○ | ⊚ | ⊚ | △ | ⊚ | ⊚ |
| 66 | Al—0.1Co—0.5Ge—0.5Si—0.5Ta | 500° C. - 30 min. | ⊚ | ⊚ | ⊚ | ⊚ | ⊚ | ⊚ | ○ | ⊚ | ⊚ | △ | ⊚ | ⊚ |

TABLE 3

| | Item | | | |
|---|---|---|---|---|
| | ⊚ | ○ | Δ | X |
| Maximum grain diameter of Al matrix (nm) | 500 or smaller | Larger than 500, 700 or smaller | Larger than 700, 800 or smaller | Larger than 800 |
| Heat resistance: Hillock density (pieces/m$^2$) | $1 \times 10^8$ or less | More than $1 \times 10^8$, less than $5 \times 10^8$ | $5 \times 10^8$ or more, less than $1 \times 10^9$ | $1 \times 10^9$ or more |
| Electrical resistivity (μΩcm) | The 1st heat treatment at 450° C. | 8.0 or smaller | Larger than 8.0, 9.0 or smaller | Larger than 9.0, 10 or smaller | Larger than 10 |
| | The 1st heat treatment at 500° C. | 8.0 or smaller | Larger than 8.0, 9.0 or smaller | Larger than 9.0, 10 or smaller | Larger than 10 |
| | The 1st heat treatment at 550° C. | 7.0 or smaller | Larger than 7.0, 8.0 or smaller | Larger than 8.0, 10 or smaller | Larger than 10 |
| | The 1st heat treatment at 600° C. | 6.0 or smaller | Larger than 6.0, 8.0 or smaller | Larger than 8.0, 10 or smaller | Larger than 10 |

The results shown in Tables 1 and 2 may be considered as follows. Specifically, as samples No. 1-4 are Al alloy films comprising conventional Al—Si, or Al—Nd or Al—Ta which are known for superior heat resistance, the maximum grain diameter of the Al matrix exceeded the upper limit, and hillocks were excessively formed beyond the stipulated range after the heat treatment, particularly those for which the first heat treatment was conducted at high temperature. On the other hand, for the samples No. 5-66 satisfying the requirement of the present invention, the maximum grain diameter of the Al matrix was small, the hillock formation was suppressed, and the electrical resistivity were small even after the second heat treatment.

Figure 2A:
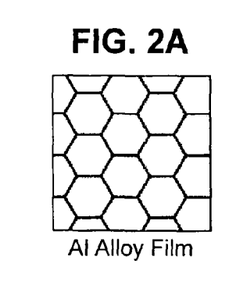
Figure 2B:
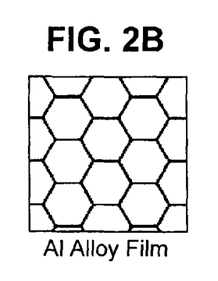
Figure 2C:
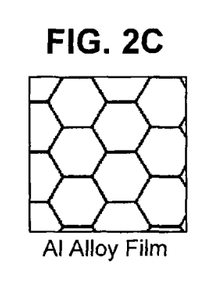
Figure 2D:
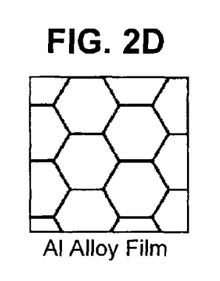
Figure 2E:
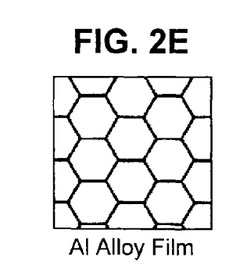
Figure 2F:
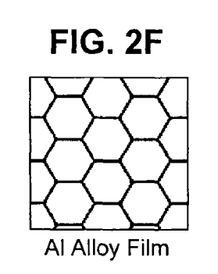
Figure 2G:
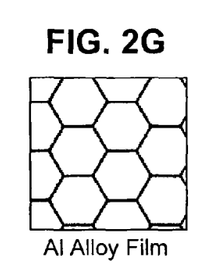
Figure 2H:
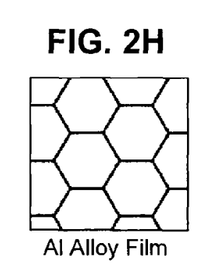
Figure 2I:
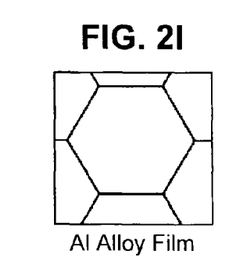
FIG. 2I is a diagram of Al alloy film which is equivalent to a comparative example, after a heat treatment at 500° C. for 30 minutes.

Regarding the relation between the heat treatment condition and the grain diameter of the Al matrix, a trend observed in Example 1 is schematically illustrated in FIGS. 2A-2I. FIGS. 2A-2D are schematics of the Al alloy films of the present invention after the first heat treatment (FIG. 2A is after the heat treatment at 450° C. for 30 minutes, FIG. 2B is after the heat treatment at 500° C. for 30 minutes, FIG. 2C is after the heat treatment at 550° C. for 30 minutes, and FIG. 2D is after the heat treatment at 600° C. for 30 minutes). FIGS. 2E-2H are schematics of the samples depicted in FIGS. 2A-2D, respectively, after the second heat treatment at 500° C. for 30 minutes. FIG. 2I illustrates a comparative example of an Al alloy film after the heat treatment at 500° C. for 30 minutes. In the Al alloy films of the present invention shown in FIGS. 2A-2H, the grain diameter of the Al matrix was small after the first heat treatment at any temperatures (450° C., 500° C., 550° C., and 600° C.). Moreover, the grain diameter of the Al matrix stayed small showing little change after the second heat treatment at 500° C. for 30 minutes. On the other hand, grains of the Al matrix in an Al alloy film of a comparative example significantly coarsened after the first heat treatment as shown in FIG. 2I.

Example 2

An Al alloy film of 500 nm in thickness having each of various alloy compositions shown in Table 4 and Table 5 was deposited by the DC magnetron sputtering method. The deposition condition was as follows. Atmosphere gas: argon, pressure: 2 mTorr, substrate temperature: 25° C. (room temperature). Single crystal Si of orientation [100] with a size of 4 inches in diameter was used as a substrate.

For the preparation of the foregoing Al alloy films of having various compositions, Al alloy targets having various compositions, which were formed by the vacuum melting method, were used as a sputtering target.

A content of each of the alloying elements in the foregoing Al alloy films was determined by the ICP emission spectrometry (inductively coupled plasma emission spectrometry) method.

Each of the Al alloy films prepared as described above was subjected to heat treatment as shown below. Then heat resistance, electrical resistivity, and the maximum grain diameter of the Al matrix of the Al alloy films were measured. Details are described hereinafter.

(1) Heat Resistance after Heat Treatment

Each of the Al alloy film was subjected to a series of heat treatment, simulating a thermal process to which an interconnection material is subjected in a fabrication process of a semiconductor device, at 450° C., 500° C., 550° C., and 600° C. in an inert (N$_2$) gas atmosphere for 30 minutes at each of the temperature as indicated in Tables 4 and 5 (the first heat treatment). Subsequently, each of the Al alloy film was subjected to five cycles of heat treatment, simulating a thermal process to which an interconnection material is subjected in an actual operation environment, at 300° C. for 5 hours as shown in Tables 4 and 5 (the second heat treatment; heating pattern 2). Some of the samples were subjected to ten or thirty cycles of the second heat treatment. The surface morphology of the Al alloy films were observed after the heat treatments with an optical microscope (magnification: ×500) to measure the density of hillocks (pieces/m$^2$). The number of hillocks having a diameter of 0.1 μm or more was counted.

The heat resistance was evaluated according to evaluation criteria described in Table 3. In this example, ⊚, ○, and Δ indicate that the corresponding films are acceptable. The results are shown in Table 4 and Table 5.

(2) Electrical Resistivity (Interconnection Resistance) of Al Alloy Film after Heat Treatment A line-and-space pattern 10 μm in width was formed on the deposited Al alloy film samples. Each of the sample was subjected to a series of heat treatment, simulating a thermal process to which an interconnection material is subjected in a fabrication process of a semiconductor device, at 450° C., 500° C., 550° C., and 600° C. in an inert (N$_2$) gas atmosphere for 30 minutes at each of the temperature as indicated in Tables 4 and 5 (the first heat treatment). Subsequently, each of the Al alloy film was subjected to five cycles of heat treatment, simulating a thermal process to which an interconnection material is subjected in an actual operation environment, at 300° C. for 5 hours as shown in Tables 4 and 5 (the second heat treatment; heating pattern 2). Some of the samples were subjected to ten or thirty cycles of the second heat treatment. Electrical resistivity of the Al alloy film was measured by four-terminal method.

The electrical resistivity was evaluated according to evaluation criteria described in Table 3. In this example, ⊚, ○, and Δ indicate that the corresponding films are acceptable. The results are shown in Table 4 and Table 5.

(3) The Maximum Grain Diameter of the Al Matrix after Heat Treatment

Each of the deposited Al alloy film was subjected to a series of heat treatment, simulating a thermal process to which an interconnection material is subjected in a fabrication process of a semiconductor device, at 450° C., 500° C., 550° C., and 600° C. in an inert ($N_2$) gas atmosphere for 30 minutes at each of the temperature as indicated in Tables 4 and 5 (the first heat treatment). Subsequently, each of the Al alloy film was subjected to five cycles of heat treatment, simulating a thermal process to which an interconnection material is subjected in an actual operation environment, at 300° C. for 5 hours as shown in Tables 4 and 5 (the second heat treatment; heating pattern 2). Some of the samples were subjected to ten or thirty cycles of the second heat treatment. The surface of the Al alloy film after the heat treatment was observed with a planar transmission electron microscope (TEM, magnification: ×150,000). The grain diameters of the Al matrix (equivalent circle diameter) observed in three fields of view (area size of one field of view is 1.2 μm×1.6 μm) at arbitrary positions of each sample were measured, and the maximum value was determined as the maximum grain size.

The grain diameter was evaluated according to evaluation criteria described in Table 3. In this example, ⊚, ○, and Δ indicate that the corresponding films are acceptable. The results are shown in Table 4 and Table 5.

TABLE 4

| No. | Chemical composition (The numerical value represents content of each element in atomic %.) | The 2nd heat treatment condition (heating pattern 2) | The 1st heat treatment condition: 450° C. - 30 min. maximum grain diameter | Hillock density | Electrical resistivity | The 1st heat treatment condition: 500° C. - 30 min. maximum grain diameter | Hillock density | Electrical resistivity | The 1st heat treatment condition: 550° C. - 30 min. maximum grain diameter | Hillock density | Electrical resistivity | The 1st heat treatment condition: 600° C. - 30 min. maximum grain diameter | Hillock density | Electrical resistivity |
|---|---|---|---|---|---|---|---|---|---|---|---|---|---|---|
| 1 | Al—1Si | 300° C. - 5 hr - 5 cycle | X | X | ◎ | X | X | ◎ | X | X | ◎ | X | X | ◎ |
| 2 | Al—2Nd | 300° C. - 5 hr - 5 cycle | X | X | ○ | X | X | △ | X | X | X | X | X | X |
| 3 | Al—0.5Ta | 300° C. - 5 hr - 5 cycle | X | X | ◎ | ○ | X | △ | ○ | X | X | △ | X | X |
| 4 | Al—5Ta | 300° C. - 5 hr - 5 cycle | ◎ | ○ | △ | ◎ | X | △ | ○ | X | X | △ | ○ | X |
| 5 | Al—0.5Ge—0.5Ta | 300° C. - 5 hr - 5 cycle | ◎ | ◎ | ◎ | ◎ | ◎ | ◎ | ○ | ◎ | ◎ | △ | ○ | ◎ |
| 6 | Al—0.1Ni—0.5Ge—0.1Ta | 300° C. - 5 hr - 5 cycle | ◎ | ◎ | ◎ | ◎ | ◎ | ◎ | ○ | ○ | ○ | △ | ○ | ○ |
| 7 | Al—0.1Ni—0.5Ge—0.5Ta | 300° C. - 5 hr - 5 cycle | ◎ | ◎ | ◎ | ◎ | ◎ | ◎ | ○ | ◎ | ◎ | ○ | ◎ | ◎ |
| 8 | Al—0.1Ni—0.5Ge—5Ta | 300° C. - 5 hr - 5 cycle | ◎ | ◎ | ◎ | ◎ | ◎ | ◎ | ○ | ◎ | ◎ | ○ | ◎ | ◎ |
| 9 | Al—3Ni—0.5Ge—0.5Ta | 300° C. - 5 hr - 5 cycle | ◎ | ◎ | ◎ | ◎ | ◎ | ◎ | ○ | ◎ | ◎ | △ | ◎ | ◎ |
| 10 | Al—0.1Ni—2Ge—0.5Ta | 300° C. - 5 hr - 5 cycle | ◎ | ◎ | ◎ | ◎ | ◎ | ◎ | ○ | ◎ | ◎ | △ | ◎ | ◎ |
| 11 | Al—0.1Ni—0.5Ge—0.5Nb | 300° C. - 5 hr - 5 cycle | ◎ | ◎ | ◎ | ◎ | ◎ | ◎ | ○ | ◎ | ◎ | △ | ◎ | ◎ |
| 12 | Al—0.1Ni—0.5Ge—0.5Re | 300° C. - 5 hr - 5 cycle | ◎ | ◎ | ◎ | ◎ | ◎ | ◎ | ○ | ◎ | ◎ | △ | ◎ | ◎ |
| 13 | Al—0.1Ni—0.5Ge—0.5Zr | 300° C. - 5 hr - 5 cycle | ◎ | ◎ | ◎ | ◎ | ◎ | ◎ | ○ | ◎ | ◎ | △ | ◎ | ◎ |
| 14 | Al—0.1Ni—0.5Ge—0.5W | 300° C. - 5 hr - 5 cycle | ◎ | ◎ | ◎ | ◎ | ◎ | ◎ | ○ | ◎ | ◎ | △ | ◎ | ◎ |
| 15 | Al—0.1Ni—0.5Ge—0.5Mo | 300° C. - 5 hr - 5 cycle | ◎ | ◎ | ◎ | ◎ | ◎ | ◎ | ○ | ◎ | ◎ | △ | ◎ | ◎ |
| 16 | Al—0.1Ni—0.5Ge—0.5V | 300° C. - 5 hr - 5 cycle | ◎ | ◎ | ◎ | ◎ | ◎ | ◎ | ○ | ◎ | ◎ | △ | ◎ | ◎ |
| 17 | Al—0.1Ni—0.5Ge—0.5Hf | 300° C. - 5 hr - 5 cycle | ◎ | ◎ | ◎ | ◎ | ◎ | ◎ | ○ | ◎ | ◎ | △ | ◎ | ◎ |
| 18 | Al—0.1Ni—0.5Ge—0.5Ti | 300° C. - 5 hr - 5 cycle | ◎ | ◎ | ◎ | ◎ | ◎ | ◎ | ○ | ◎ | ◎ | △ | ◎ | ◎ |
| 19 | Al—0.1Ni—0.5Ge—0.5Cr | 300° C. - 5 hr - 5 cycle | ◎ | ◎ | ◎ | ◎ | ◎ | ◎ | ○ | ◎ | ◎ | ○ | ◎ | ◎ |
| 20 | Al—0.1Ni—0.5Ge—0.5Pt | 300° C. - 5 hr - 5 cycle | ◎ | ◎ | ◎ | ◎ | ◎ | ◎ | ○ | ○ | ○ | ○ | ○ | ○ |
| 21 | Al—0.1Ni—0.5Ge—0.5Ta—0.5Zr | 300° C. - 5 hr - 5 cycle | ◎ | ◎ | ◎ | ◎ | ◎ | ◎ | ○ | ◎ | ◎ | △ | ◎ | ◎ |
| 22 | Al—0.1Ni—0.5Ge—0.5Cu—0.5Ta | 300° C. - 5 hr - 5 cycle | ◎ | ◎ | ◎ | ◎ | ◎ | ◎ | ○ | ◎ | ◎ | △ | ◎ | ◎ |
| 23 | Al—0.1Co—0.5Ge—0.5Ta | 300° C. - 5 hr - 5 cycle | ◎ | ◎ | ◎ | ◎ | ◎ | ◎ | ○ | ◎ | ◎ | △ | ◎ | ◎ |
| 24 | Al—0.5Si—0.5Ta | 300° C. - 5 hr - 5 cycle | ◎ | ◎ | ◎ | ◎ | ◎ | ◎ | ○ | ○ | ○ | ○ | ○ | ○ |
| 25 | Al—0.1Ni—0.5Si—0.1Ta | 300° C. - 5 hr - 5 cycle | ◎ | ◎ | ◎ | ◎ | ◎ | ◎ | ○ | ◎ | ◎ | △ | ◎ | ◎ |
| 26 | Al—0.1Ni—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 27 | Al—0.1Ni—0.5Si—5Ta | 300° C. - 5 hr - 5 cycle | ◎ | ◎ | ◎ | ◎ | ◎ | ◎ | ○ | ◎ | ○ | ○ | ◎ | ○ |
| 28 | Al—3Ni—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 29 | Al—0.1Ni—2Si—0.5Ta | 300° C. - 5 hr - 5 cycle | ◎ | ◎ | ◎ | ◎ | ◎ | ◎ | ○ | ◎ | ◎ | △ | ◎ | ◎ |
| 30 | Al—0.1Ni—0.5Si—0.5Nb | 300° C. - 5 hr - 5 cycle | ◎ | ◎ | ◎ | ◎ | ◎ | ◎ | ○ | ◎ | ◎ | ○ | ◎ | ◎ |
| 31 | Al—0.1Ni—0.5Si—0.5Re | 300° C. - 5 hr - 5 cycle | ◎ | ◎ | ◎ | ◎ | ◎ | ◎ | ○ | ○ | ○ | ○ | ○ | ○ |
| 32 | Al—0.1Ni—0.5Si—0.5Zr | 300° C. - 5 hr - 5 cycle | ◎ | ◎ | ◎ | ◎ | ◎ | ◎ | ○ | ◎ | ◎ | △ | ◎ | ◎ |
| 33 | Al—0.1Ni—0.5Si—0.5W | 300° C. - 5 hr - 5 cycle | ◎ | ◎ | ◎ | ◎ | ◎ | ◎ | ○ | ◎ | ◎ | △ | ◎ | ◎ |
| 34 | Al—0.1Ni—0.5Si—0.5Mo | 300° C. - 5 hr - 5 cycle | ◎ | ◎ | ◎ | ◎ | ◎ | ◎ | ○ | ◎ | ◎ | △ | ◎ | ◎ |

TABLE 5

| No. | Chemical composition (The numerical value represents content of each element in atomic %.) | The 2nd heat treatment condition (heating pattern 2) | The 1st heat treatment condition: 450° C. - 30 min. maximum grain diameter | Hillock density | Electrical resistivity | The 1st heat treatment condition: 500° C. - 30 min. maximum grain diameter | Hillock density | Electrical resistivity | The 1st heat treatment condition: 550° C. - 30 min. maximum grain diameter | Hillock density | Electrical resistivity | The 1st heat treatment condition: 600° C. - 30 min. maximum grain diameter | Hillock density | Electrical resistivity |
|---|---|---|---|---|---|---|---|---|---|---|---|---|---|---|
| 35 | Al—0.1Ni—0.5Si—0.5V | 300° C. - 5 hr - 5 cycle | ◎ | ◎ | ◎ | ◎ | ◎ | ◎ | ○ | ◎ | ◎ | △ | ◎ | ◎ |
| 36 | Al—0.1Ni—0.5Si—0.5Hf | 300° C. - 5 hr - 5 cycle | ◎ | ◎ | ◎ | ◎ | ◎ | ◎ | ○ | ◎ | ◎ | △ | ◎ | ◎ |
| 37 | Al—0.1Ni—0.5Si—0.5Ti | 300° C. - 5 hr - 5 cycle | ◎ | ◎ | ◎ | ◎ | ◎ | ◎ | ○ | ◎ | ◎ | △ | ◎ | ◎ |
| 38 | Al—0.1Ni—0.5Si—0.5Cr | 300° C. - 5 hr - 5 cycle | ◎ | ◎ | ◎ | ◎ | ◎ | ◎ | ○ | ◎ | ◎ | △ | ◎ | ◎ |
| 39 | Al—0.1Ni—0.5Si—0.5Pt | 300° C. - 5 hr - 5 cycle | ◎ | ◎ | ◎ | ◎ | ◎ | ◎ | ○ | ◎ | ◎ | △ | ◎ | ◎ |
| 40 | Al—0.1Ni—0.5Si—0.5Ta—0.5Zr | 300° C. - 5 hr - 5 cycle | ◎ | ◎ | ◎ | ◎ | ◎ | ◎ | ○ | ◎ | ◎ | ○ | ◎ | ◎ |
| 41 | Al—0.1Ni—0.5Si—0.5Cu—0.5Ta | 300° C. - 5 hr - 5 cycle | ◎ | ◎ | ◎ | ◎ | ◎ | ◎ | ○ | ○ | ◎ | △ | ◎ | ◎ |
| 42 | Al—0.1Co—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 43 | Al—0.5Ge—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 44 | Al—0.1Ni—0.5Ge—0.5Si—0.1Ta | 300° C. - 5 hr - 5 cycle | ◎ | ◎ | ◎ | ◎ | ◎ | ◎ | ○ | ◎ | ◎ | △ | ◎ | ◎ |
| 45 | Al—0.1Ni—0.5Ge—0.3Si—0.5Ta | 300° C. - 5 hr - 5 cycle | ◎ | ◎ | ◎ | ◎ | ◎ | ◎ | ○ | ◎ | ◎ | △ | ◎ | ◎ |
| 46 | Al—0.1Ni—0.5Ge—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 47 | Al—0.1Ni—0.5Ge—1.0Si—0.5Ta | 300° C. - 5 hr - 5 cycle | ◎ | ◎ | ◎ | ◎ | ◎ | ○ | ○ | ◎ | ○ | △ | ◎ | ◎ |
| 48 | Al—0.1Ni—0.5Ge—1.0Si—0.5Ta | 300° C. - 5 hr - 10 cycle | ◎ | ◎ | ◎ | ◎ | ◎ | ◎ | ○ | ◎ | ◎ | △ | ◎ | ◎ |
| 49 | Al—0.1Ni—0.5Ge—1.0Si—0.5Ta | 300° C. - 5 hr - 30 cycle | ◎ | ◎ | ◎ | ◎ | ◎ | ◎ | ○ | ◎ | ◎ | △ | ◎ | ◎ |
| 50 | Al—0.1Ni—0.5Ge—2.5Si—0.5Ta | 300° C. - 5 hr - 5 cycle | ◎ | ◎ | ◎ | ◎ | ◎ | ◎ | ○ | ◎ | ◎ | △ | ◎ | ◎ |
| 51 | Al—0.1Ni—0.5Ge—0.5Si—5Ta | 300° C. - 5 hr - 5 cycle | ◎ | ◎ | ◎ | ◎ | ◎ | ◎ | ○ | ◎ | ◎ | ○ | ◎ | ◎ |
| 52 | Al—3Ni—0.5Ge—0.5Si—0.5Ta | 300° C. - 5 hr - 5 cycle | ◎ | ◎ | ◎ | ◎ | ◎ | ◎ | ○ | ◎ | ◎ | ○ | ◎ | ◎ |
| 53 | Al—2Ge—0.5Si—0.5Ta | 300° C. - 5 hr - 5 cycle | ◎ | ◎ | ◎ | ◎ | ◎ | ◎ | ○ | ◎ | ◎ | ○ | ◎ | ◎ |
| 54 | Al—0.1Ni—0.5Ge—0.5Si—0.5Nb | 300° C. - 5 hr - 5 cycle | ◎ | ◎ | ◎ | ◎ | ◎ | ◎ | ○ | ◎ | ◎ | △ | ◎ | ◎ |
| 55 | Al—0.1Ni—0.5Ge—0.5Si—0.5Re | 300° C. - 5 hr - 5 cycle | ◎ | ◎ | ◎ | ◎ | ◎ | ◎ | ○ | ◎ | ◎ | △ | ◎ | ◎ |
| 56 | Al—0.1Ni—0.5Ge—0.5Si—0.5Zr | 300° C. - 5 hr - 5 cycle | ◎ | ◎ | ◎ | ◎ | ◎ | ◎ | ○ | ◎ | ◎ | △ | ◎ | ◎ |
| 57 | Al—0.1Ni—0.5Ge—0.5Si—0.5W | 300° C. - 5 hr - 5 cycle | ◎ | ◎ | ◎ | ◎ | ◎ | ◎ | ○ | ◎ | ◎ | △ | ◎ | ◎ |
| 58 | Al—0.1Ni—0.5Ge—0.5Si—0.5Mo | 300° C. - 5 hr - 5 cycle | ◎ | ◎ | ◎ | ◎ | ◎ | ◎ | ○ | ◎ | ◎ | △ | ◎ | ◎ |
| 59 | Al—0.1Ni—0.5Ge—0.5Si—0.5V | 300° C. - 5 hr - 5 cycle | ◎ | ◎ | ◎ | ◎ | ◎ | ◎ | ○ | ◎ | ◎ | △ | ◎ | ◎ |
| 60 | Al—0.1Ni—0.5Ge—0.5Si—0.5Hf | 300° C. - 5 hr - 5 cycle | ◎ | ◎ | ◎ | ◎ | ◎ | ◎ | ○ | ◎ | ◎ | △ | ◎ | ◎ |
| 61 | Al—0.1Ni—0.5Ge—0.5Si—0.5Ti | 300° C. - 5 hr - 5 cycle | ◎ | ◎ | ◎ | ◎ | ◎ | ◎ | ○ | ◎ | ◎ | △ | ◎ | ◎ |
| 62 | Al—0.1Ni—0.5Ge—0.5Si—0.5Cr | 300° C. - 5 hr - 5 cycle | ◎ | ◎ | ◎ | ◎ | ◎ | ◎ | ○ | ◎ | ◎ | △ | ◎ | ◎ |
| 63 | Al—0.1Ni—0.5Ge—0.5Si—0.5Pt | 300° C. - 5 hr - 5 cycle | ◎ | ◎ | ◎ | ◎ | ◎ | ◎ | ○ | ◎ | ◎ | △ | ◎ | ◎ |
| 64 | Al—0.1Ni—0.5Ge—0.3Si—0.5Ta—0.5Zr | 300° C. - 5 hr - 5 cycle | ◎ | ◎ | ◎ | ◎ | ◎ | ◎ | ○ | ◎ | ◎ | ○ | ◎ | ◎ |
| 65 | Al—0.1Ni—0.5Ge—0.5Si—0.5Ta—0.5Zr | 300° C. - 5 hr - 5 cycle | ◎ | ◎ | ◎ | ◎ | ◎ | ◎ | ○ | ◎ | ◎ | ○ | ◎ | ◎ |
| 66 | Al—0.1Ni—0.5Ge—2.5Si—0.5Ta—0.5Zr | 300° C. - 5 hr - 5 cycle | ◎ | ◎ | ◎ | ◎ | ◎ | ◎ | ○ | ◎ | ◎ | △ | ◎ | ◎ |
| 67 | Al—0.1Ni—0.5Ge—0.5Si—0.5Cu—0.5Ta | 300° C. - 5 hr - 5 cycle | ◎ | ◎ | ◎ | ◎ | ◎ | ◎ | ○ | ◎ | ◎ | △ | ◎ | ◎ |
| 68 | Al—0.1Co—0.5Ge—0.5Si—0.5Ta | 300° C. - 5 hr - 5 cycle | ◎ | ◎ | ◎ | ◎ | ◎ | ◎ | ○ | ◎ | ◎ | △ | ◎ | ◎ |

The results shown in Tables 4 and 5 may be considered as follows. Specifically, as samples No. 1-4 do not satisfy the requirement of the present invention, the maximum grain diameter of the Al matrix exceeded the upper limit, and hillocks were excessively formed beyond the stipulated range after the repetitive cycles of the heat treatments. On the other hand, for the samples No. 5-68 satisfying the requirement of the present invention, the maximum grain diameter of the Al matrix, the hillock density, and the electrical resistivity were smaller even after the second heat treatment.

For examples of the chemical composition of Al-0.1Ni-0.5Ge-1.0Si-0.5Ta, the second heat treatment was carried out ten cycles (sample No. 48) and thirty cycles (sample No. 49). Excellent characteristics were observed for samples subjected to the increased numbers of cycle of heat treatment as for those with five cycles of the treatment.

Example 3

An Al alloy film having each of various alloy compositions with various thicknesses ranging from 600 nm to 4 μm as shown in Table 6 was deposited by the DC magnetron sputtering method. The deposition condition was as follows. Atmosphere gas: argon, pressure: 2 mTorr, substrate temperature: 25° C. (room temperature). Single crystal Si of orientation [100] with a size of 4 inches in diameter was used as a substrate.

For the preparation of the foregoing Al alloy films of having various compositions, Al alloy targets having various compositions, which were formed by the vacuum melting method, were used as a sputtering target.

A content of each of the alloying elements in the foregoing Al alloy films was determined by the ICP emission spectrometry (inductively coupled plasma emission spectrometry) method.

For each of the Al alloy film prepared as described above, heat treatments were conducted in the same manner as for Example 2. For Example 3, the number of heat cycle was five in the 2nd heat treatment as shown in Table 6. Then, their heat resistance, electrical resistivity of the Al alloy films, and the maximum grain diameter of the Al matrix were measured. The result is summarized in Table 6.

TABLE 6

| No. | Chemical composition (The numerical value represents content of each element in atomic %.) | Film thickness | The $2^{nd}$ heat treatment condition (heating pattern 2) | The $1^{st}$ heat treatment condition: 450° C. - 30 min. | | |
|---|---|---|---|---|---|---|
| | | | | maximum grain diameter | Hillock density | Electrical resistivity |
| 1 | Al—1Si | 600 nm | 300° C. - 5 hr - 5 cycle | X | X | ◎ |
| 2 | Al—1Si | 4 μm | 300° C. - 5 hr - 5 cycle | X | ○ | ◎ |
| 3 | Al—2Nd | 600 nm | 300° C. - 5 hr - 5 cycle | X | X | Δ |
| 4 | Al—2Nd | 4 μm | 300° C. - 5 hr - 5 cycle | X | ◎ | ○ |
| 5 | Al—0.1Ni—0.5Ge—1Si—0.5Ta | 600 nm | 300° C. - 5 hr - 5 cycle | ◎ | ◎ | ◎ |
| 6 | Al—0.1Ni—0.5Ge—1Si—0.5Ta | 1 μm | 300° C. - 5 hr - 5 cycle | ◎ | ◎ | ◎ |
| 7 | Al—0.1Ni—0.5Ge—1Si—0.5Ta | 2 μm | 300° C. - 5 hr - 5 cycle | ◎ | ◎ | ◎ |
| 8 | Al—0.1Ni—0.5Ge—1Si—0.5Ta | 4 μm | 300° C. - 5 hr - 5 cycle | ◎ | ◎ | ◎ |

| No. | The $1^{st}$ heat treatment condition: 500° C. - 30 min. | | | The $1^{st}$ heat treatment condition: 550° C. - 30 min. | | | The $1^{st}$ heat treatment condition: 600° C. - 30 min. | | |
|---|---|---|---|---|---|---|---|---|---|
| | maximum grain diameter | Hillock density | Electrical resistivity | maximum grain diameter | Hillock density | Electrical resistivity | maximum grain diameter | Hillock density | Electrical resistivity |
| 1 | X | X | Δ | X | X | X | X | X | X |
| 2 | X | X | Δ | X | X | X | X | X | X |
| 3 | X | X | Δ | X | X | X | X | X | X |
| 4 | X | ○ | Δ | X | Δ | X | X | X | X |
| 5 | ◎ | ◎ | ◎ | ○ | ◎ | ◎ | Δ | ○ | ◎ |
| 6 | ◎ | ◎ | ◎ | ○ | ◎ | ◎ | Δ | ○ | ◎ |
| 7 | ◎ | ◎ | ◎ | ○ | ◎ | ◎ | Δ | ◎ | ◎ |
| 8 | ◎ | ◎ | ◎ | ○ | ◎ | ◎ | Δ | ◎ | ◎ |

The results shown in Table 6 may be considered as follows. Specifically, as samples No. 1-4 do not satisfy the requirement of the present invention, the maximum grain diameter of the Al matrix exceeded the upper limit, and hillocks were excessively formed beyond the stipulated range after the heat treatments. On the other hand, for the samples No. 5-8 satisfying the requirement of the present invention, the maximum grain diameter of the Al matrix, the hillock density, and the electrical resistivity were smaller after the second heat treatment regardless of the film thickness.

For examples No. 1-3, the first heat treatment was conducted for 30 minutes at each temperatures. The same results were obtained in case the treatments were extended to 200 minutes.

While the present invention has been described in detail above with references to specific embodiments thereof, it will be apparent to one with skill in the art that various changes and modifications may be made without departing from the spirit and scope of the present invention.

This application claims the benefit of Japanese Patent Application No. 2011-110791 filed May 17, 2011, which are hereby incorporated by reference herein in their entirety.

INDUSTRIAL APPLICABILITY

According to the present invention, since the Al alloy film is superior in heat resistance (heat resistance at high temperatures in particular), heat treatment for a purpose of activation of ions in a collector layer may be carried out at high temperature in, for example, a fabrication process of IGBT having the Al alloy film as an electrode or an interconnection of the semiconductor device. Deterioration of device characteristics may also be reduced even in a case where the semiconductor device is repeatedly subjected to a temperature range from approximately 250° C. to 350° C. in actual operation environment. Moreover, an Al alloy film having low electrical resistivity and thus a reduced film thickness may be provided. As a result, a power semiconductor device of improved characteristics having the Al alloy film, and a semiconductor device having superior characteristics such as the IGBT including the semiconductor device, may be provided.

The invention claimed is:

1. An Al alloy film,
wherein the Al alloy film has a film thickness of from 500 nm to 5 μm, and
the Al alloy film satisfies:
(a) a maximum grain diameter of an Al matrix is 800 nm or less,
(b) a hillock density is less than $1 \times 10^9$ pieces/m$^2$, and
(c) an electrical resistivity is 10 μΩcm or less,
after subjecting the Al alloy film to a heat treatment at 500° C. for 30 minutes or to 5 cycles of a heat treatment at 300° C. for 5 hours.

2. The Al alloy film according to claim 1, wherein the Al alloy film satisfies:
(a) the maximum grain diameter of the Al matrix is 800 nm or less,
(b) the hillock density is less than $1 \times 10^9$ pieces/m$^2$, and
(c) the electrical resistivity is 10 μΩcm or less,
after subjecting the Al alloy film to 5 cycles of a heat treatment at 300° C. for 5 hours.

3. The Al alloy film according to claim 1, wherein the Al alloy film comprises at least one element X selected from a group consisting of Ta, Nb, Re, Zr, W, Mo, V, Hf, Ti, Cr and Pt, and
at least one of Si and Ge.

4. The Al alloy film according to claim 3, wherein the Al alloy film further comprises at least one of Ni and Co.

5. The Al alloy film according to claim 4, wherein an amount of the at least one of Ni and Co is from 0.1 to 3 atomic percent.

6. The Al alloy film according to claim 3, wherein the Al alloy film further comprises Cu.

7. The Al alloy film according to claim 6, wherein an amount of Cu is from 0.1 to 2 atomic percent.

8. The Al alloy film according to claim 3, wherein an amount of the at least one element X is from 0.1 to 5 atomic percent.

9. The Al alloy film according to claim 3, wherein an amount of the at least one of Si and Ge is from 0.1 to 3 atomic percent.

10. A sputtering target for fabricating the Al alloy film according to claim 1, the sputtering target comprising:
Al,
at least one element X selected from a group consisting of Ta, Nb, Re, Zr, W, Mo, V, Hf, Ti, Cr, and Pt in an amount of from 0.1 to 5 atomic percent, and
at least one of Si and Ge in an amount of from 0.1 to 3 atomic percent.

11. The sputtering target according to claim 10, further comprising:
at least one of Ni and Co in an amount of from 0.1 to 3 atomic percent.

12. The sputtering target according to claim 10, further comprising:
Cu in an amount of from 0.1 to 2 atomic percent.

13. A semiconductor apparatus comprising the Al alloy film according to claim 1.

14. A semiconductor device comprising the Al alloy film according to claim 1.

15. An electrode, comprising:
the Al alloy film according to claim 1.

16. An interconnection comprising:
the Al alloy film according to claim 1.

17. A semiconductor structure comprising the Al alloy film according to claim 1 on a substrate,
wherein the substrate and the Al alloy film are in direct contact with each other.

18. The semiconductor structure according to claim 17, wherein the substrate is a Si substrate, a SiC substrate, or a GaN substrate.

19. The Al alloy film according to claim 1,
wherein the Al alloy film satisfies:
(a) the maximum grain diameter of the Al matrix is 800 nm or less,
(b) the hillock density is less than $1 \times 10^9$ pieces/m$^2$, and
(c) the electrical resistivity is 10 μΩcm or less,
after subjecting the Al alloy film to a heat treatment at 500° C. for 30 minutes.

* * * * *